United States Patent
Celaru et al.

(10) Patent No.: US 9,230,846 B2
(45) Date of Patent: Jan. 5, 2016

(54) MULTI-WAFER ROTATING DISC REACTOR WITH INERTIAL PLANETARY DRIVE

(75) Inventors: Adrian Celaru, Hauppauge, NY (US); Todd A. Luse, Kings Park, NY (US); Ajit P. Paranjpe, Basking Ridge, NJ (US); Joseph Scandariato, Elmont, NY (US); Qingfu Tang, Port Jefferson, NY (US)

(73) Assignee: Veeco Instruments, Inc., Plainview, NY (US)

(*) Notice: Subject to any disclaimer, the term of this patent is extended or adjusted under 35 U.S.C. 154(b) by 1204 days.

(21) Appl. No.: 13/153,679

(22) Filed: Jun. 6, 2011

(65) Prior Publication Data
US 2011/0300297 A1    Dec. 8, 2011

Related U.S. Application Data

(60) Provisional application No. 61/351,966, filed on Jun. 7, 2010.

(51) Int. Cl.
C23C 16/00 (2006.01)
H01L 21/687 (2006.01)
C23C 16/458 (2006.01)

(52) U.S. Cl.
CPC ...... H01L 21/68764 (2013.01); C23C 16/4584 (2013.01); H01L 21/68771 (2013.01)

(58) Field of Classification Search
CPC .............................................. H01L 21/68785
See application file for complete search history.

(56) References Cited

U.S. PATENT DOCUMENTS

| | | | |
|---|---|---|---|
| 3,424,628 A | | 1/1969 | Winings |
| 3,889,632 A | * | 6/1975 | Brunner et al. ............... 118/730 |
| 3,983,838 A | * | 10/1976 | Christensen ................. 118/730 |
| 4,284,033 A | | 8/1981 | del Rio |
| 5,029,555 A | | 7/1991 | Dietrich et al. |

(Continued)

FOREIGN PATENT DOCUMENTS

| | | | |
|---|---|---|---|
| JP | 63147894 A | * | 6/1988 |
| JP | 3069119 A | | 3/1991 |
| JP | 2001168034 A | | 6/2001 |

OTHER PUBLICATIONS

Nowakowski, L., "Planetary Motion Fixture Plate for Thin Film Deposition", IBM TDB Sep. 1, 1986.

(Continued)

*Primary Examiner* — Gordon R Baldwin
*Assistant Examiner* — Charlee Bennett
(74) *Attorney, Agent, or Firm* — Wood, Herron & Evans, LLP

(57) ABSTRACT

Wafer carriers and methods for moving wafers in a reactor. The wafer carrier may include a platen with a plurality of compartments and a plurality of wafer platforms. The platen is configured to rotate about a first axis. Each of the wafer platforms is associated with one of the compartments and is configured to rotate about a respective second axis relative to the respective compartment. The platen and the wafer platforms rotate with different angular velocities to create planetary motion therebetween. The method may include rotating a platen about a first axis of rotation. The method further includes rotating each of a plurality of wafer platforms carried on the platen and carrying the wafers about a respective second axis of rotation and with a different angular velocity than the platen to create planetary motion therebetween.

5 Claims, 15 Drawing Sheets

(56) References Cited

U.S. PATENT DOCUMENTS

| | | | |
|---|---|---|---|
| 5,468,299 A | 11/1995 | Tsai | |
| 2005/0072266 A1 | 4/2005 | Zaech et al. | |
| 2007/0098895 A1* | 5/2007 | Smith | 427/255.7 |
| 2011/0083602 A1 | 4/2011 | Bergmann et al. | |
| 2012/0321788 A1* | 12/2012 | Yang | 427/255.5 |

OTHER PUBLICATIONS

European Patent Office, Search Report and Written Opinion issued in related International application No. PCT/US2011/039441 dated Aug. 18, 2011.

* cited by examiner

MULTI-WAFER ROTATING DISC REACTOR WITH INERTIAL PLANETARY DRIVE

CROSS-REFERENCE TO RELATED APPLICATIONS

This application claims the benefit of U.S. Provisional Application No. 61/351,966, filed Jun. 7, 2010, the content of which is hereby incorporated by reference herein in its entirety for all purposes.

BACKGROUND

The invention generally relates to vacuum processing systems and methods and, in particular, to mechanisms and methods for improving material uniformity in the chemical vapor and physical vapor deposition systems.

Due to the current growth in the LED and OLED markets, there is an ever increasing demand for efficient and high throughput manufacturing methods and systems. Current high throughput manufacturing systems use chemical vapor deposition (CVD) to deposit material on several substrate wafers simultaneously and thus to maximize their throughput. Yield per wafer is typically related to the uniformity of the deposition on it, with a more uniform deposition resulting in a higher yield.

In the past and current CVD systems, the means for achieving improved uniformity included heating of a wafer carrier, varying shape of a reaction chamber, modifying shower head characteristic as well as rotating the wafer carrier. All of these methods were used with varying degree of success with much improvement still needed. In particular, when rotating a wafer carrier containing multiple substrate wafers it is desirable to rotate it at a rate different from that of the wafers, thereby creating planetary motion. This allows a greater control over a deposition profile as well real time correction of various defects in the deposition's uniformity.

Currently available methods for creating planetary motion of the wafers on a wafer carrier include continuously driven planetary gearing system, application of circulating gasses under the substrate and vibration of the wafer carrier to induce rotation of the wafers. Each of these systems has its own drawbacks. A typical continuously driven planetary gearing system consists of a set of gears which continuously drive both a plurality of wafer platforms and the wafer carrier. The gears of the mechanism are continuously loaded by both the mass of the wafer carrier and the mass of plurality of wafer platforms. Addition of the thermal stress due to high operational temperatures adds to the mechanical stress in the mechanism and results in lower reliability and higher particle generation. Planetary motion through application of circulating gases limits operation of the wafers carrier to the low rpm range in order to maintain planetary motion as well as degrades CVD process performance by interfering with the reaction gases and increasing the total gas load on the system's pump. The use of vibration to create planetary motion does not guarantee equal magnitude of rotation for all of the wafers on the wafer carrier as well as limits possible wafer carrier rotation rates.

Thus, there is a need for a mechanism which improves deposition uniformity without negative impacts on maintenance and operational rpm of the wafer carrier. The mechanism must also ensure equal magnitude of rotation among all of the wafers on the wafer carrier.

BRIEF SUMMARY

In one embodiment, a deposition system includes a deposition source, a reaction chamber, a drive shaft mounted within the chamber for rotating therein about an axis, and a wafer carrier positioned on the top of the drive shaft. The drive shaft is rotated by a motor directly coupled to the drive shaft. The wafer carrier contains a platen, a plurality of wafer platforms, a friction-reducing coupling between each of the wafer platforms and the platen, and a friction-reducing coupling between the drive shaft and the platen. The rotation of the drive shaft is transferred to a plurality of the wafer platforms through a coupling between the wafer platforms and the drive shaft thereby exhibiting planetary motion.

In one embodiment, a method for rotating the wafers includes rotating a drive shaft at a set rotational rate and transmitting the rotation through a coupling to the plurality of wafer platforms. Rotation of the plurality of wafer platforms transmits rotation to a platen of the wafer carrier. Once the plurality of the wafer platforms and the platen overcome their initial inertias, an equilibrium state is reached. During the equilibrium state, the wafer platforms remains stationary with respect to the platen and the drive mechanism experiences a lower operational load.

During the initial start up (i.e., starting from resting position) and prior to reaching the equilibrium state, the maximum rotation rate of the wafer platforms can be adjusted by limiting the acceleration rate of the drive shaft. During a shutdown sequence (i.e., returning to resting position), the maximum rotation rate of the wafer platforms can also be controlled by limiting the deceleration rate of the drive shaft.

When the equilibrium state is reached, a change in the rotation rate of the drive shaft creates a deviation from the equilibrium state between the platform and the wafer platforms due to the mass differences. The deviation from the equilibrium state marks the start of a platform rotation cycle. Prior to reestablishment of the equilibrium state, the wafer platforms experience a different rotation rate with respect to the platen during which the drive mechanism experiences an increase in the operational load. Reestablishment of the equilibrium state marks the completion of the platform rotation cycle. The rotation rate of the wafer platforms is equal among all of the platforms and is proportional to the change in rotation rate of the platen. A change in the rotation rate of the platen of the wafer carrier also determines the direction of rotation of the wafer platforms during each platform rotation cycle thereby supporting multiple modes of operation.

In one operation mode, the wafer platforms can be made to rotate in only one direction, such as only clockwise or counterclockwise, during each consecutive platform rotation cycle. In an alternative operation mode, the wafer platforms can be made to rotate in alternate directions during each of the platform rotation cycles. Another mode of operation can be a combination of these operation modes.

Because the drive mechanism experiences an increased load over only a small portion of the operation period, the drive mechanism is not a source for particle generation during a typical operation cycle. In order to optimize the mechanism's performance in the high temperature environment of the reaction chamber, components such as gears, wafer platforms and the platen of the wafer carrier can be comprised of high-temperature resistant materials. In one embodiment, the bearings are comprised of a ceramic material, while the platen of the wafer carrier and the wafer platforms are comprised of SiC-coated graphite material to minimize thermal expansion, and thermal stresses during the operation.

The above embodiments present improvements over conventional methods of achieving a planetary motion, as well as improvement in deposition uniformity. The inertial drive mechanism, unlike the prior art mechanisms, creates the planetary motion in a controlled and synchronous manner for the wafer platforms. The planetary motion achieved by the mechanism does not experience a significant degradation in performance at the high rotation rates of the wafer carrier, nor significant mechanical degradation due to harsh operation environment, nor does the mechanism become a significant source for a particle generation or reaction gas contamination inside the reaction chamber. Such advancements in the mechanical performance of the mechanism produce corresponding improvements in the deposition uniformity by providing a more consistent and even exposure of substrates to the deposition source.

In addition, the planetary motion mechanism presents an improvement in the serviceability of a tool by providing several ways for removal and cleaning of the mechanism and the wafer carrier from the reaction chamber. One of such methods is removal of the wafer carrier simultaneously with the wafer platforms while both are still coupled together. The resulting assembly is subjected to the required cleaning procedures after which it is returned into the reaction chamber. An alternative method involves decoupling the wafer carrier from the wafer platforms, and subsequently subjecting each to the required cleaning procedures. After cleaning, the wafer platforms and the wafer carrier are reassembled and returned to the reaction chamber.

In an embodiment, the wafer carrier includes a platen with a plurality of compartments and a plurality of wafer platforms. The platen is configured to rotate about a central axis. Each of the wafer platforms is associated with one of the compartments and is configured to rotate relative to the respective compartment. The platen and the wafer platforms rotate with different angular velocities to create planetary motion therebetween.

The wafer carrier may include a drive shaft, a plurality of first gears, and a second gear meshed with each of the first gears. Each of the first gears may be attached to one of the wafer platforms. The second gear is coupled with the drive shaft to be rotated by the drive shaft and transfer the rotation to the first gears to cause powered rotation of the wafer platforms.

The wafer platforms of the wafer carrier may be comprised of graphite (e.g., Grade ST-81), and the wafer carrier may further include a plurality of threaded inserts carried by each of the wafer platforms and a plurality of fasteners used to secure one of the first gears with the inserts. The threaded inserts may be comprised of molybdenum or an alloy thereof, such as molybdenum alloy 364.

The platen of the wafer carrier may be driven to rotate about the first axis by the drive shaft.

The wafer carrier may include a drive shaft coupled to the platen and a plurality of belt couplings. Each of the belt couplings connects one of the wafer platforms to the drive shaft.

The wafer carrier may include a drive shaft having an inner spindle connected with the platen and an outer spindle, a plurality of first gears, and a second gear meshed with each of the first gears. Each of the first gears is attached to one of the wafer platforms. The second gear is connected with the outer spindle. The second gear may be driven by the inner spindle to cause rotation of the first gears. The first gears may be driven by the outer spindle to cause rotation of the first gears.

The wafer carrier may include a plurality of friction-reducing bearings. One of the friction-reducing bearings is disposed between each of the wafer platforms and the platen.

The platen and the wafer platforms of the wafer carrier are configured to rotate at different angular velocities. The compartments may have a circular arrangement on the platen. The compartments are distributed on the platen in first and second concentric circular arrangements of different diameters.

The wafer carrier may further include a drive shaft coupled to the platen and configured to rotate the platen at a first angular velocity. The wafer platforms may be free of direct mechanical connections with the drive shaft and rotation of the platen at the first angular velocity may cause free rotation of each wafer platen relative to the respective compartment at a second angular velocity.

In an embodiment, a method is provided for moving wafers in a reactor. The method includes rotating a platen about a first axis of rotation. The method further includes rotating each of a plurality of wafer platforms carried in compartments on the platen and carrying the wafers about a respective second axis of rotation and with a different angular velocity than the platen to create planetary motion therebetween.

Rotation of the wafer platforms may result from a transfer of torque from a drive shaft to each of the wafer platforms. The torque transfer may be produced by spinning a first gear connected with the drive shaft at a first angular velocity to generate the torque and transferring the torque from the first gear to a second gear attached to each of the wafer platforms and thereby cause rotation of the wafer platforms. Alternatively, the torque transfer may be produced by spinning the drive shaft at a first angular velocity to generate the torque and transferring the torque with belt couplings from the drive shaft to each of the wafer platforms and thereby cause rotation of the wafer platforms.

The rotation of the platen about the first axis of rotation may include transferring torque from the drive shaft to the platen to cause rotation about the first axis at a first angular velocity. The wafer platforms may be free of direct mechanical connections with the drive shaft and rotation of the platen at the first angular velocity may cause free rotation of each wafer platform relative to the respective compartment at a second angular velocity. The angular velocity of the drive shaft may be modulated with a time-varying profile to generate the different angular velocities of the platen and the wafer platforms.

DETAILED DESCRIPTION

Figure 1:
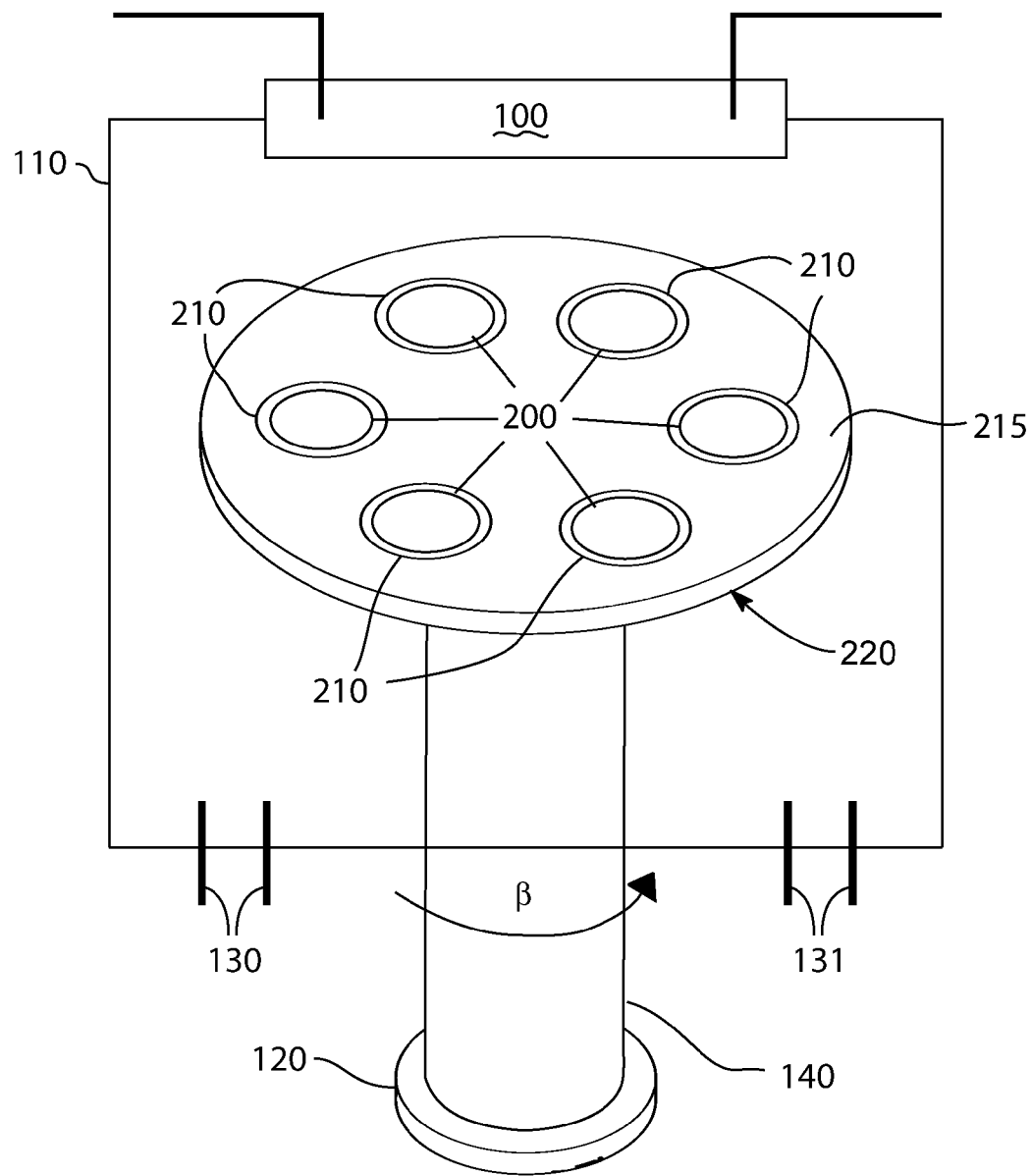
FIG. 1 is a diagrammatic view of one of the embodiments of a multi-wafer rotating disk reactor of the present invention.

FIG. 1 provides a diagrammatic representation of an embodiment of a multi-wafer rotating disk reactor. A reaction chamber 110 includes a wafer carrier 220 and a flange 100 placed therein. The wafer carrier 220 includes a platen 215 and a plurality of wafer platforms 210 on which plurality of wafers 200 are placed. The wafer carrier 220 serves dual purposes of positioning the wafers 200 inside of the reaction chamber 110 as well support for the wafers 200 during wafer transfer in and out of the reaction chamber 110. The platen 215 of wafer carrier 220 is seated over the drive shaft 140, which is rotated by a motor 120.

The flange 100 may be a showerhead coupled with a precursor source configured to supply one or more precursor gases to the reaction chamber. In a typical MOCVD system, the precursor gases are composed of a metallorganic gas and the corresponding reacting species required for the chemical reaction. A plurality of substrates or wafers 200 are located inside of the reaction chamber 110 on the wafer platforms 210 and serve as sites for the chemical reaction and subsequent epitaxial growth. The heat required for the chemical reaction is supplied by the heating elements 131. The by-products of the chemical reaction are organic gases, which are released through the exhaust outlets 130.

There are numerous types of heaters that can be used to supply heat for the chemical reaction transpiring on the wafers 200. In one embodiment, a radiant heater can be positioned proximate to the wafer carrier 220 in order to heat the wafers 200 to a desired process temperature. In another embodiment, RF induction coils can be positioned proximate to the wafer carrier 220 so that energy from the RF induction coils heats the wafers 200. In yet another embodiment, the heat required for the chemical reaction can be supplied by a serpentine heating element which can be comprised of, for example, infrared heating elements. One skilled in the art will appreciate that other types of heaters can be used to heat the wafers 200. In addition, one skilled in the art will appreciate that more than one type of heater can be used to heat the wafers 200.

Figure 2:
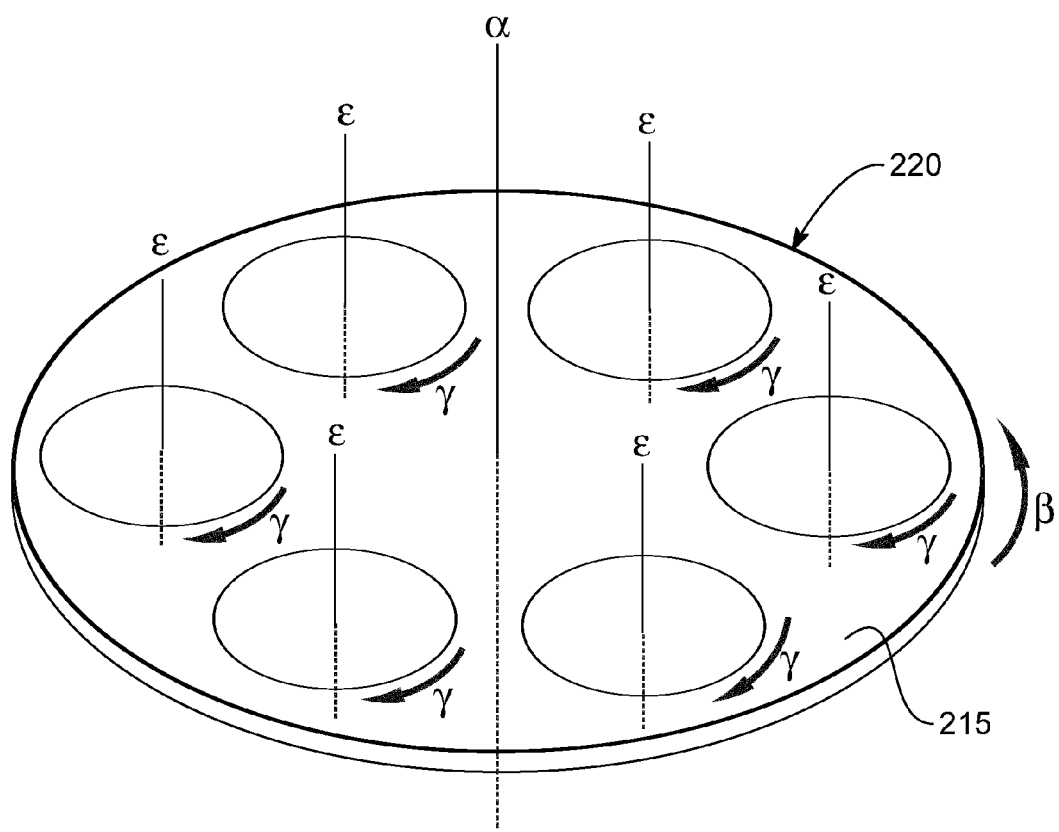
FIG. 2 is a perspective view of the embodiment of a wafer carrier for use with the present invention.

FIG. 2 provides a side perspective representation of one of the embodiments of a wafer carrier for use with the present invention. The motor 120 (FIG. 1) provides primary rotation to the drive shaft around the central axis of the drive shaft ($\alpha$) at a first rate ($\lambda$). The rotation is transmitted through the motion mechanism to the plurality of wafer platforms 210 producing rotation at second rate ($\gamma$). Rotation of the wafer platforms 210 induces rotation of the platen 215 of the wafer carrier 220 at third rate of rotation ($\beta$).

Figure 3:
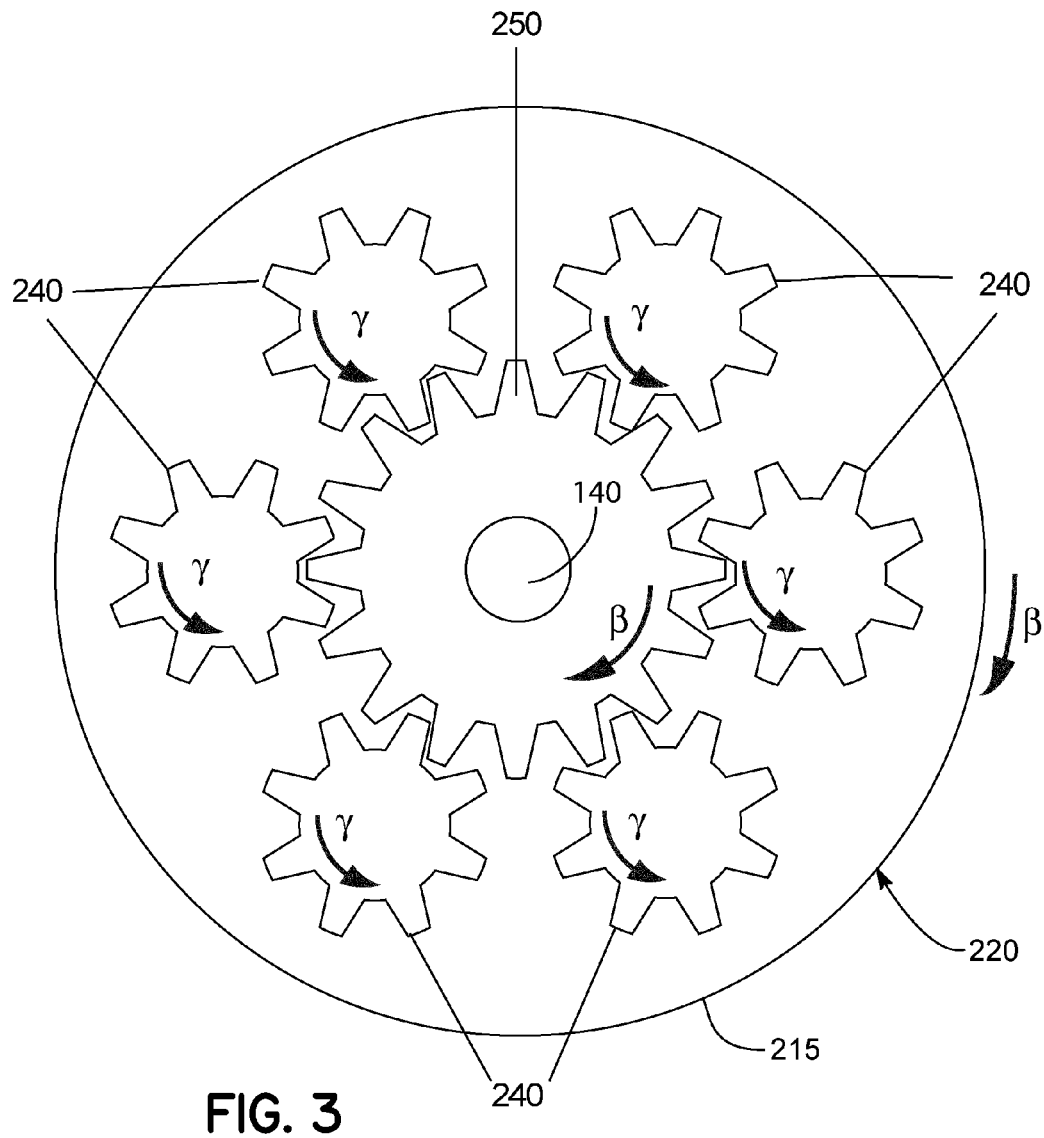
FIG. 3 is a bottom view of the wafer carrier in FIG. 2.

FIG. 3 provides a bottom representation of one of the embodiments of a motion mechanism for use with the present invention. The drive shaft 140 is fixed to the central gear 250 causing it to rotate at the first rotation rate ($\lambda$). The central gear 250 is connected to the platform gears 240 through a meshing of the gear teeth. Gearing ratios between the central gear 250 and the gear 240 of each wafer platform 210 creates the second rotation rates ($\gamma$). The rotation rate corresponds to a number of complete revolutions a gear makes per a given time period. The circumference of the gear determines the angular distance the gear travels in a given period of time and thus the corresponding angular velocity of the gear. If the gear is coupled to another object (such as wafer platform 210), the object's angular velocity with respect to rotation rate of the gear is related to its circumference in the same manner.

Figure 4:
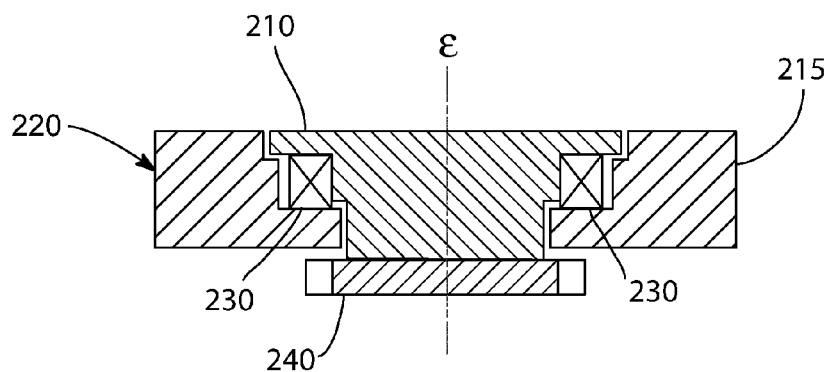
FIG. 4 is a cross-sectional view of an embodiment of one of the wafer platforms and a compartment in a platen of a wafer carrier for use with an embodiment of the present invention.

FIG. 4 provides a cross-sectional representation of one embodiment of a wafer platform for the wafer carrier for use with the present invention. The wafer platform 210 is positioned over the friction-reducing bearing 230 with coaxial alignment. The platform gear 240 is fixed to the wafer platform 210. The diameter of the platform gear 240 with respect to the wafer platform 210 can vary in size with the maximum diameter limited by the spacing between the wafer platforms 210 and location of the central gear 241. If the base material for the platform gear 240 and the wafer platform 210 is SiC or graphite, the diameter of the platform gear 240 can be designed to match that of the wafer platform 210 at the point of contact to facilitate easy installation and removal of wafer platforms. The wafer platform 210 and the friction-reducing bearing 230 are located inside a compartment (unlabeled but similar to compartment 770 (FIGS. 13-15)) defined in the wafer carrier 220. The wafer platform 210 is held in its position inside the wafer carrier 220 through a combination of its weight and compartmentalization within the platen 215 of the wafer carrier 220. Each wafer platform 210 is configured to rotate about an axis of rotation $\epsilon$ and the platen 215 is configured to rotate about an axis of rotation $\alpha$. In one embodiment, the axes of rotation $\epsilon$, $\alpha$ may be respectively centered on the disk-shaped platen 215 and wafer platform 210.

Figure 5:
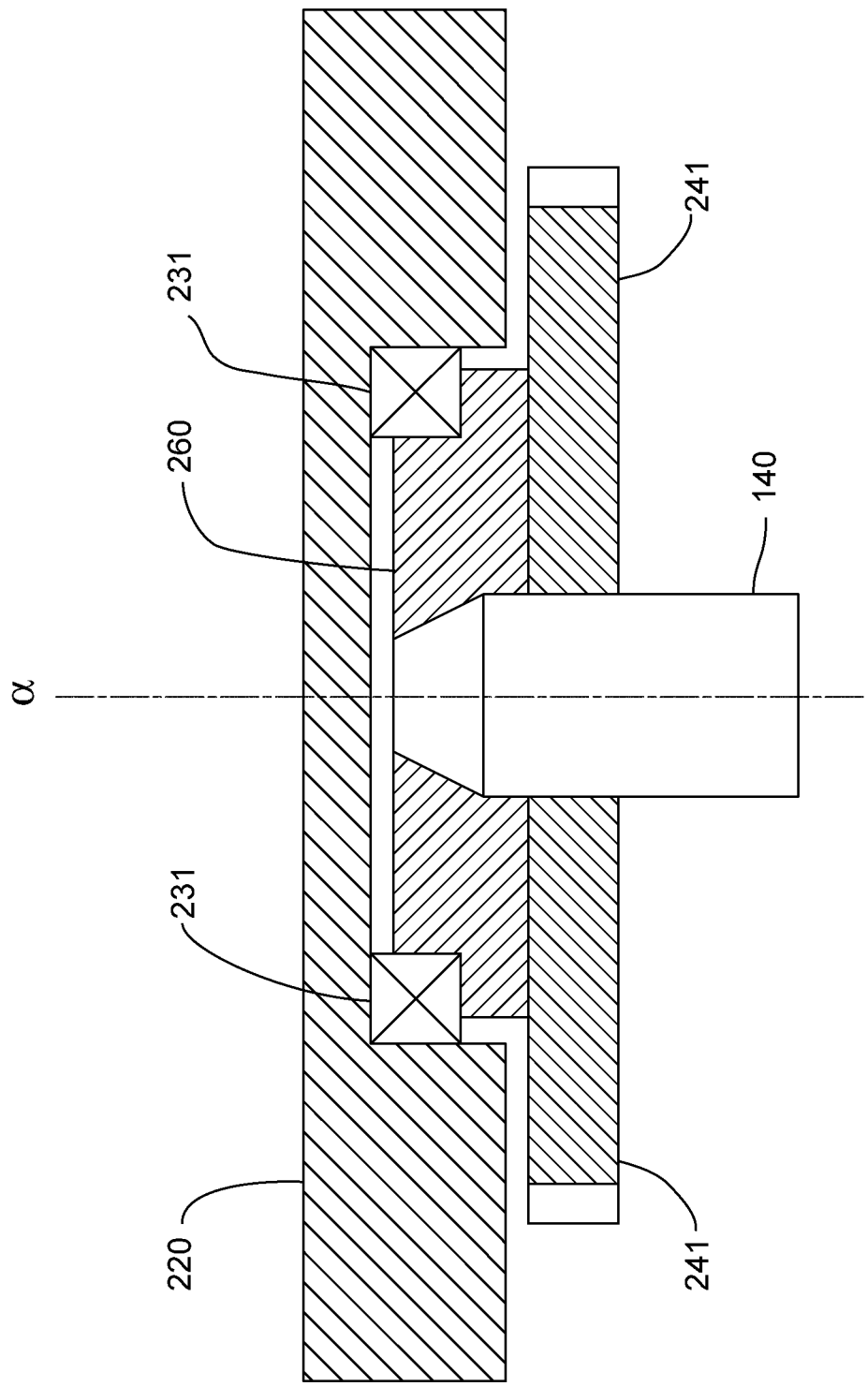
FIG. 5 is a cross-sectional view of an embodiment of a drive shaft compartment of a wafer carrier for use with an embodiment of the present invention.

FIG. 5 provides a cross-sectional representation of one embodiment of a drive shaft compartment of a wafer carrier for use with the present invention. The intermediate member 260 is positioned over the drive shaft 140. The synchronization pin couples rotation of the drive shaft 140 to the rotation of the intermediate member 260. The central gear 241 is fixed to the intermediate member 260 and rotates at the same rate. The friction-reducing bearing 231 is positioned over the intermediate member 260 and aligned coaxially with it. The platen 215 of wafer carrier 220 is positioned over the friction-reducing bearing 231.

Figure 6:
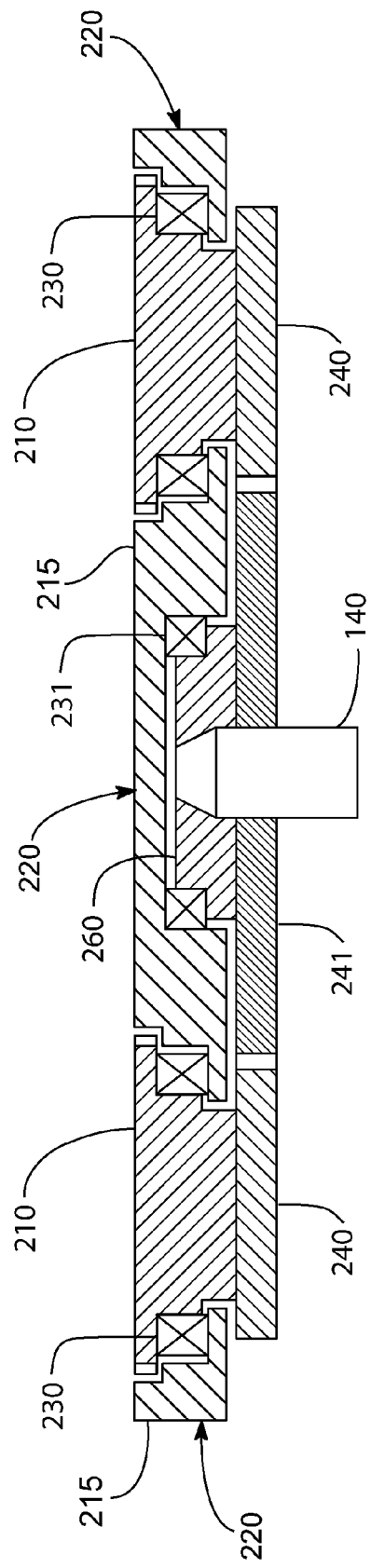
FIG. 6 is a cross-sectional view of an embodiment of a wafer carrier assembly including an assembly of the platen and wafer platforms of FIGS. 4, 5.

FIG. 6 provides a cross-sectional representation of one embodiment of a wafer carrier assembly composed of the combination of structures shown and described in FIG. 4 and FIG. 5. Drive shaft 140 transmits rotation to each of the wafer platforms 210 through respective gear couplings composed of the central gear 241 and one of the platform gears 240. The platen 215 of wafer carrier 220 is positioned over the drive shaft 140 through friction-reducing bearing 231. The wafer platforms 210 are positioned over the wafer carrier 220 through respective friction-reducing bearings 230. Rotation of the wafer platforms 210 about the internal axis of the drive shaft 140 transmits rotation to the platen 215 of wafer carrier 220.

Figure 7:
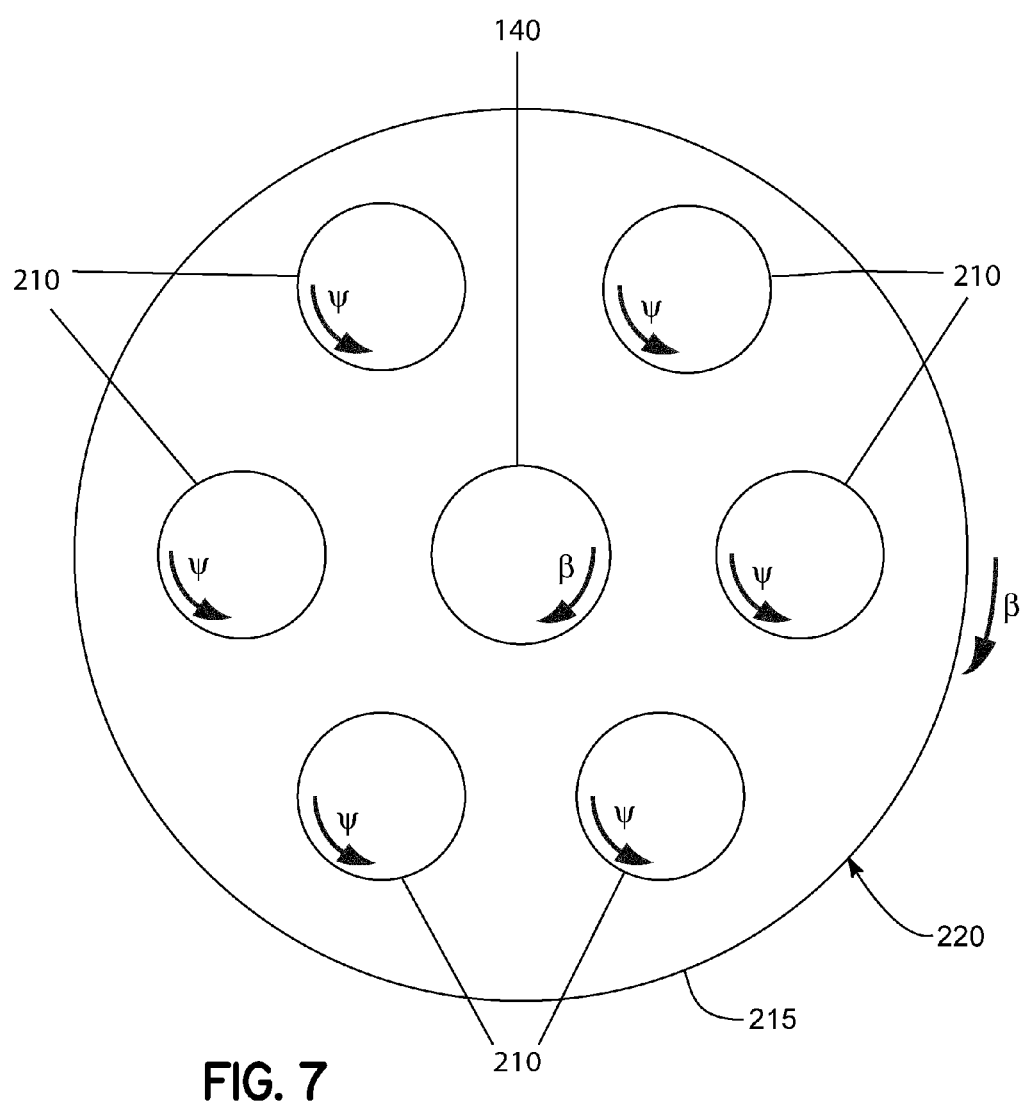
FIG. 7 is a bottom view of an alternative embodiment of the wafer carrier in FIG. 3.

FIG. 7 provides an alternative embodiment of a motion mechanism in accordance with the present invention and in which like reference numerals refer to like features in FIGS. 1-6. In this embodiment, the drive shaft 140 is coupled to the wafer carrier 220. Wafer platforms 210 are not directly coupled to the drive shaft 140. Rotation rate ($\beta$) of the drive shaft 140 is the same as rotation of the platen 215 of wafer carrier 220. The centripetal force created during wafer carrier's rotation creates rotation of the wafer platforms 210, producing rotation rate ($\phi$) for each.

Figure 8:
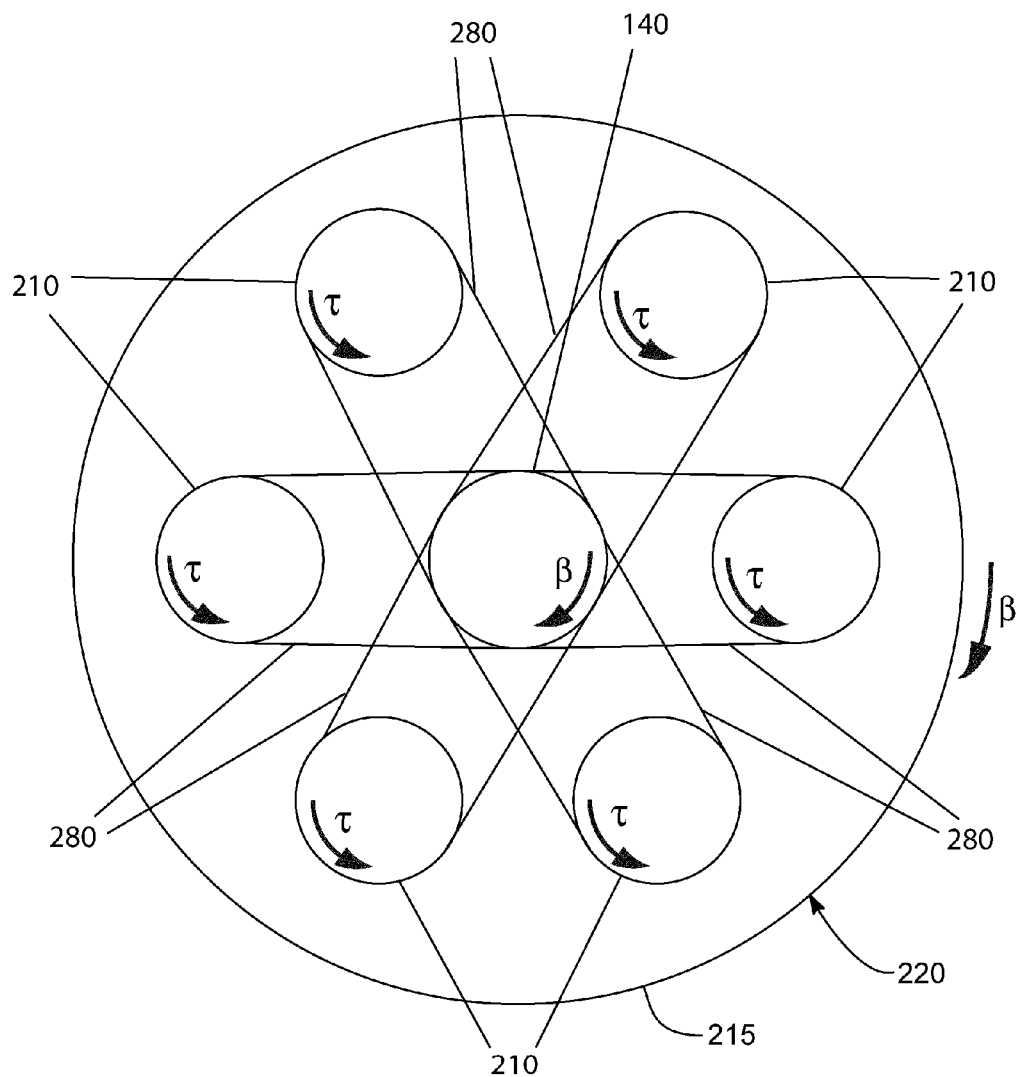
FIG. 8 is a bottom view of an alternative embodiment of the wafer carrier in FIG. 3.

FIG. 8 provides an alternative embodiment of a motion mechanism in accordance with the present invention and in which like reference numerals refer to like features in FIGS. 1-6. In this embodiment, the drive shaft 140 is coupled to the platen 215 of wafer carrier 220. The wafer platforms 210 are coupled to the drive shaft 140 through respective belt couplings 280 coupled with respective pins affixed to the wafer platforms 210. The rate of rotation ($\beta$) of the platen 215 of wafer carrier 220 is the same as that of the drive shaft 140. The rate of rotation ($\tau$) of the wafer platforms 210 is related to rate of rotation ($\beta$) of the drive shaft 140 through the ratio of their circumferences.

Figure 9:
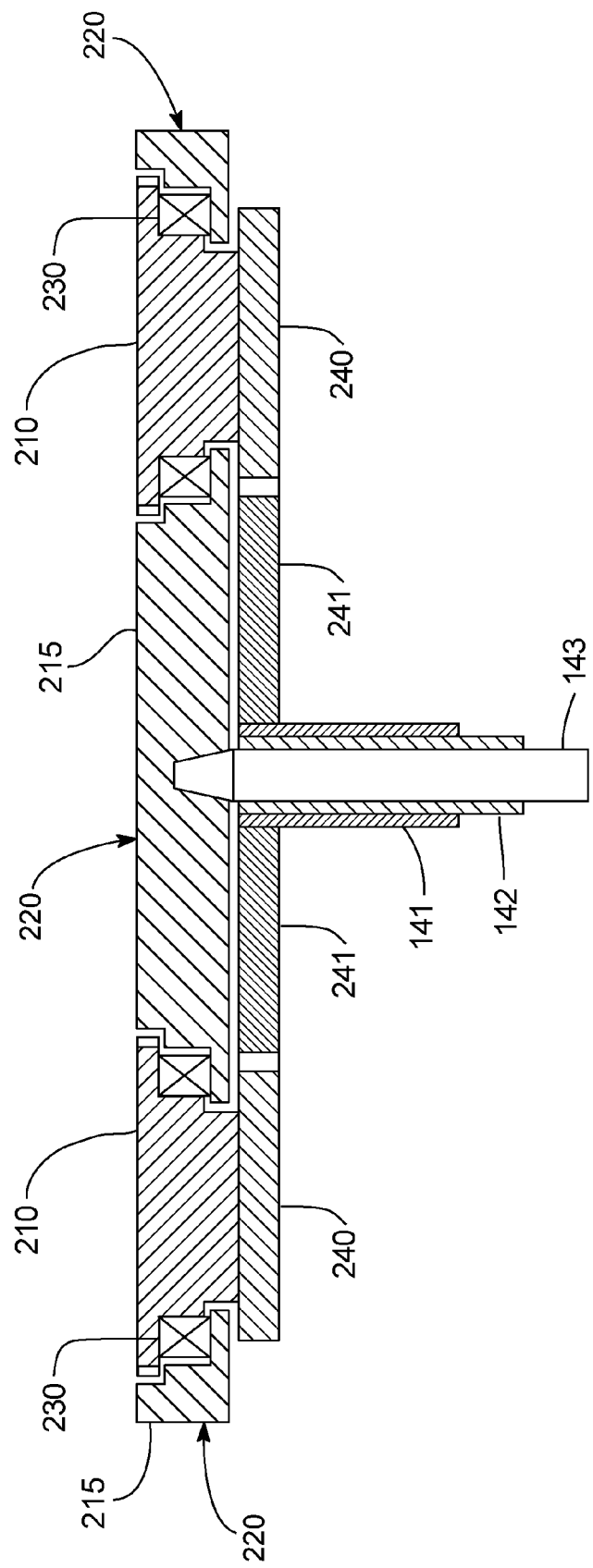
FIG. 9 is a cross-sectional view of an alternative embodiment of the wafer carrier assembly in FIG. 6.

FIG. 9 provides an alternative embodiment of a wafer carrier assembly in FIG. 6 and in which like reference numerals refer to like features in FIGS. 1-8. The platen 215 of wafer carrier 220 is positioned over and fixed to the inner spindle 143 of the drive shaft 140. The central gear 241 is fixed to the outer spindle 141 of the drive shaft 140. Friction-reducing member 142 separates rotation of the inner spindle 143 from the outer spindle 141. There are several modes of operation for this embodiment comprising of: only the inner spindle 143 driving, only the outer spindle 141 driving, both the inner and the outer spindle driving. In the mode with inner spindle 143 driving, rotation is transmitted to the platen 215 of wafer carrier 220 which then transmits it to the wafer platforms 210 and subsequently to the outer spindle 141. In the mode with the outer spindle 141 driving, the rotation is transmitted to the wafer platforms 210 which then transmit it to the platen 215 of wafer carrier 220 and subsequently to the inner spindle 143. An alternative operation mode consists of the inner spindle 143 driving the platen 215 of wafer carrier 220 and the outer spindle 141 driving the wafer platforms 210.

The spindles 141, 143 may be driven by a common motor with the two drive shafts operating in unison. Alternatively, a modified coupling may permit the dual shaft configuration to be used in a single shaft inertial drive mode.

Figure 10:
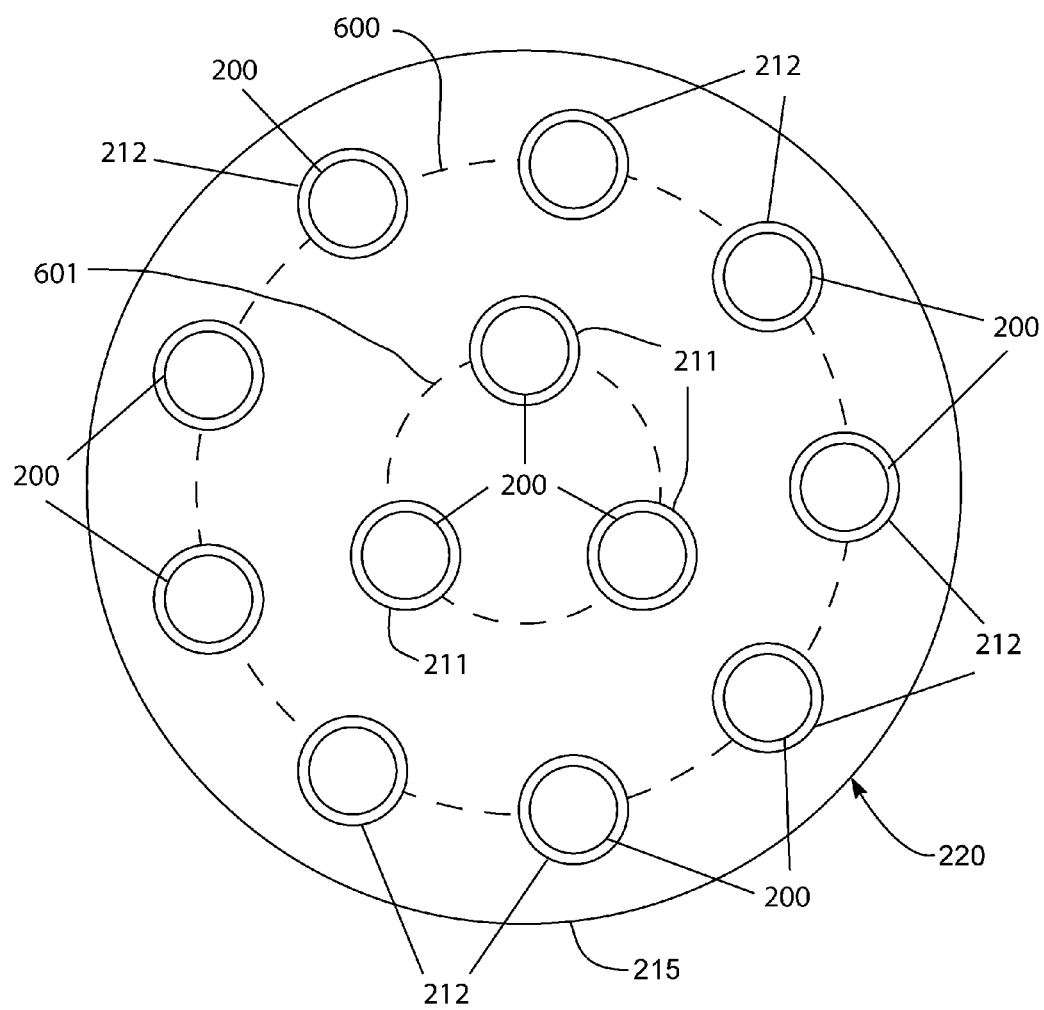
FIG. 10 is a top view of an alternative embodiment of a wafer carrier assembly.

FIG. 10 provides an alternative embodiment of a wafer carrier assembly in FIG. 1 and in which like reference numerals refer to like features in FIGS. 1-9. In this embodiment, a plurality of inner wafer platforms 211 and a plurality of outer wafer platforms 212 are included, and the wafers 200 are located annularly around the inner axis of the wafer carrier 220. The inner annulus 601 locates the centers of the inner wafer platforms 211. The outer annulus 600 locates the centers of the outer wafer platforms 212. The inner and outer wafer platforms 211, 212 may be concentrically arranged about the axis of rotation of the drive shaft 140.

Figure 10A:
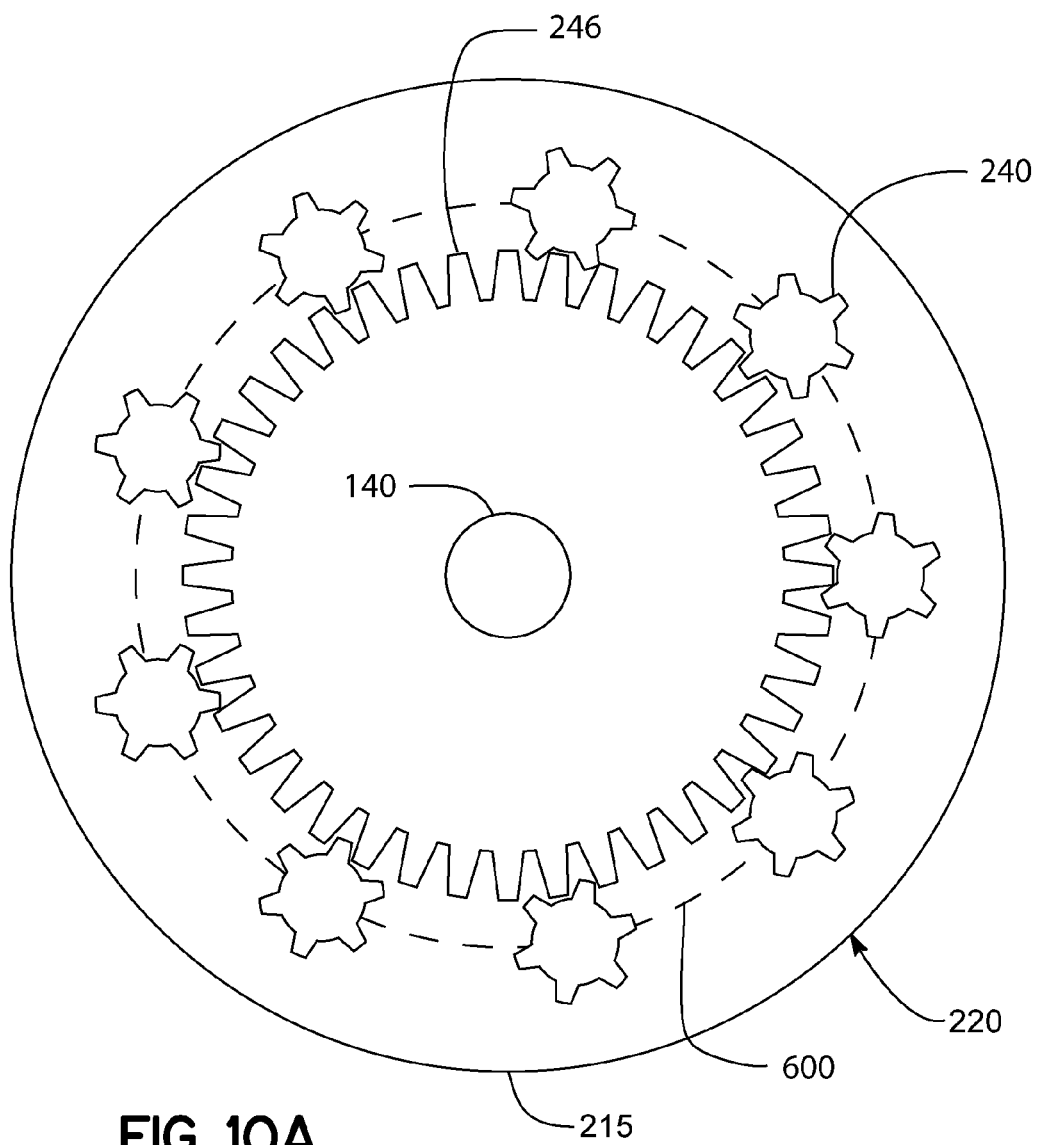
FIGS. 10A and 10B are bottom views of the wafer carrier assembly in FIG. 10.
Figure 10B:
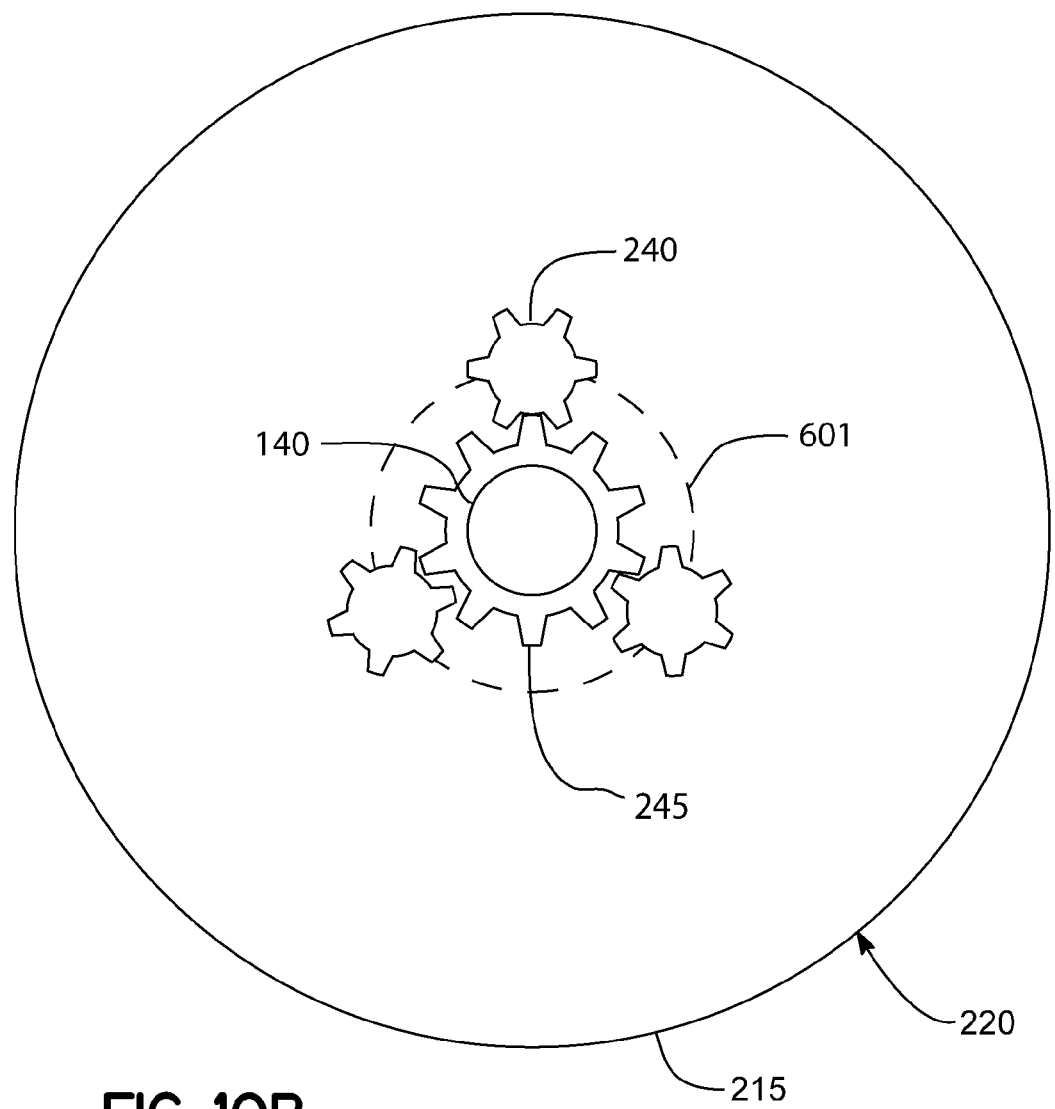

FIGS. 10A and 10B provide bottom views of the wafer carrier assembly in FIG. 10. FIG. 10A provides the bottom view of the platform gears 240 for the outer wafer platforms 212 located on the outer annulus 600 and the corresponding driving mechanism. The drive shaft 140 is coupled to the large central gear 246, which in turn is coupled by tooth meshing to the platform gears 240. The rotation from the drive shaft 140 is transmitted through the large central gear 246 to the platform gears 240 attached to the outer wafer platforms 212. FIG. 10B provides the bottom view of the platform gears 240 for the inner wafer platforms 211 located on the inner annulus 601 and the corresponding driving mechanism. The drive shaft 140 is coupled to the large central gear 245, which in turn is coupled by tooth meshing to the platform gears 240 attached to the inner wafer platforms 211. The rotation from the drive shaft 140 is transmitted through the smaller central gear 245 to the platform gears 240.

Figure 10C:
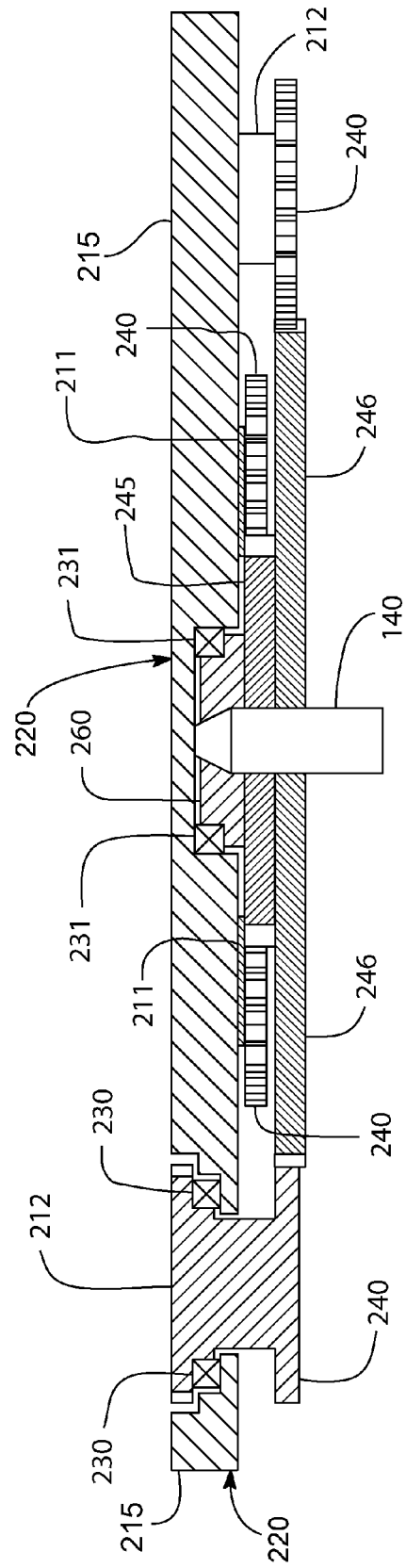
FIG. 10C is a cross sectional view of the wafer carrier assembly in FIG. 10.

FIG. 10C provides a cross-sectional view of the wafer platform assembly in FIG. 10. The platen 215 of wafer carrier 220 is positioned coaxially, on top of the friction-reducing bearing 231. The friction-reducing bearing 231 is positioned coaxially, on top of the intermediate member 260. The intermediate member 260 is positioned coaxially over the drive shaft 140. The smaller central gear 245 and the larger central gear 246 are coupled to the drive shaft 140. The two central gears 245, 246 can exist as two separate parts coupled together or as two different features of a single part. The smaller central gear 245 is coupled by affixation or attachment to each platform gear 240 located on the inner annulus 601. Each platform gear 240 on the inner annulus 601 is coupled to one of the wafer platforms 211. The larger central gear 246 is coupled to the platform gear 240 located on the outer annulus 600. The platform gears 240 are affixed to the outer wafer platforms 212 on the outer annulus 600. Each of the outer wafer platforms 212 is located in a wafer platform cutout or compartment inside the wafer carrier 220, positioned coaxially on top of the friction-reducing bearing 230. The friction-reducing bearing 230 is positioned inside the platen 215 of wafer carrier 220, coaxially to the corresponding wafer platform's cutout and allows rotation of each wafer platform 212 independently of the platen 215 of the wafer carrier 220. The inner wafer platforms 211 are positioned inside compartments of the platen 215 of wafer carrier 220 in the same way as the outer wafer platform 212, except for the location on the radial position corresponding to the inner annulus 601.

As a result, the planetary motion is extended to multiple rings of planet platforms. As examples, the outer and inner annuli may be in a 12 inch by 4 inch or a 14 inch by 4 inch configuration. An embodiment for implementing multiple planet rings may be a stepped sun gear with the upper level (i.e., smaller central gear 245) on the sun gear driving the inner planet platforms and the lower level (i.e., central gear 246) driving the outer planet platforms. An alternative embodiment for implementing multiple planet rings is for the sun gear to drive the inner planet platforms and a transfer gear between the inner planet platforms and gears on one or more of the outer planets to spin the outer planets. In this case, the outer planets could be coupled with each other and direction of rotation would be different for each pair of planets and requires an even number of outer planets.

Figure 11:
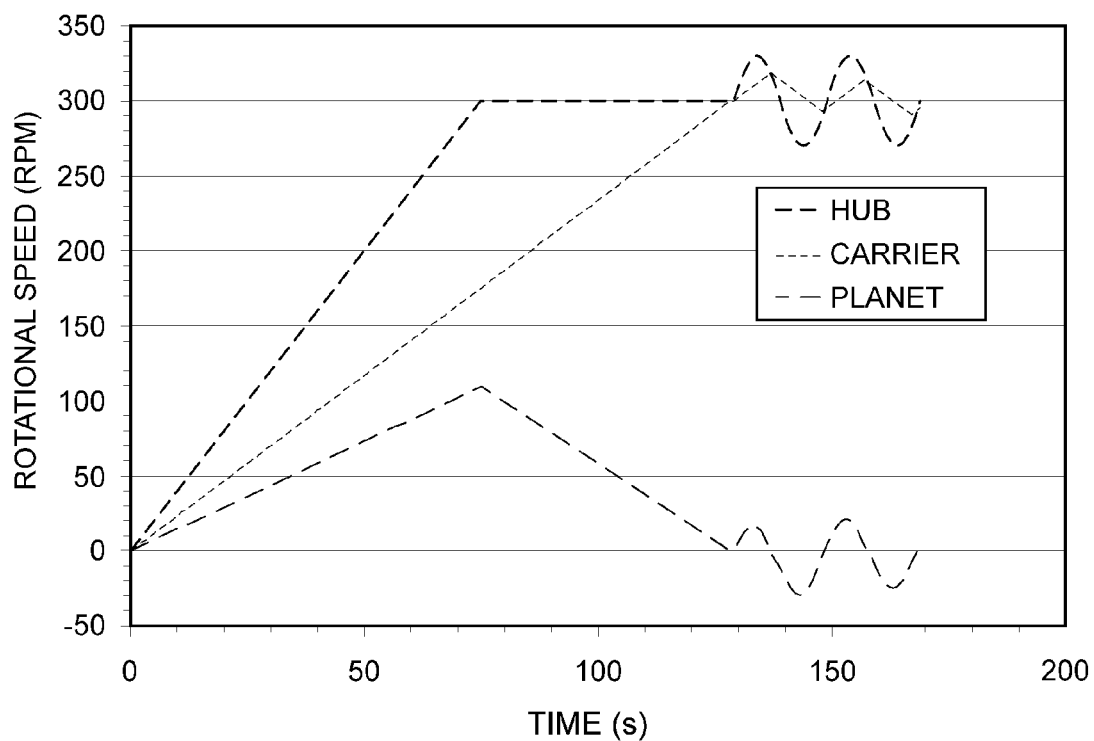
FIG. 11 is a graphical representation of one of the modes of operation.

FIG. 11 provides a graphical representation of one of the modes of operation. This graph demonstrates the angular velocity of the hub (i.e., drive shaft), the platen (i.e., carrier) of the wafer carrier and the planet (i.e., wafer platform). As the hub is accelerated from 0 RPM to 300 RPM, the planet and the carrier experience a corresponding change in their angular velocities. As the hub's velocity remains at constant, the planet decelerates to an angular velocity of nearly 0 RPM while the carrier continues to accelerate until its velocity reaches that of the hub. Subsequent sinusoidal oscillations in the angular velocity of the hub result in the oscillation of the angular velocity of the carrier and the planets. The angular velocity of the planet is equal to the difference between angular velocities of the hub and the carrier.

Alternatively, other types of time-based profiles, such as a sawtooth driving profile, may be used instead of a sinusoidal in the inertial drive mode. Each period of a time-based profile consists of acceleration/deceleration jogs that cause each planet to spin a fraction of a rotation in a given direction to achieve unidirectional rotation of the planet.

A controller may be used to provide the driving profiles to motors cause rotary motion of the drive shaft(s). The controller may comprise any electrical control apparatus configured to control one or more variables based upon one or more user inputs. Those user inputs can be provided by the user through a user interface that can be a key board, mouse and display, or touch screen, for example. The controller can be implemented using at least one processor selected from microprocessors, micro-controllers, microcomputers, digital signal processors, central processing units, field programmable gate arrays, programmable logic devices, state machines, logic circuits, analog circuits, digital circuits, and/or any other devices that manipulate signals (analog and/or digital) based on operational instructions that are stored in a memory. The memory may be a single memory device or a plurality of memory devices including but not limited to random access memory (RAM), volatile memory, non-volatile memory, static random access memory (SRAM), dynamic random access memory (DRAM), flash memory, cache memory, and/or any other device capable of storing digital information. The controller may have a mass storage device that may include one or more hard disk drives, floppy or other removable disk drives, direct access storage devices (DASD), optical drives (e.g., a CD drive, a DVD drive, etc.), and/or tape drives, among others.

The processor of the controller operates under the control of an operating system, and executes or otherwise relies upon computer program code embodied in various computer software applications, components, programs, objects, modules, data structures, etc. The computer program code residing in memory and stored in the mass storage device also includes control program code that, when executing on the processor, provides control signals as current pulses to the motor(s) to provide the driving profiles. The computer program code typically comprises one or more instructions that are resident at various times in memory, and that, when read and executed by the processor, causes the controller to perform the steps necessary to execute steps or elements embodying the various embodiments and aspects of the invention.

Various program code described herein may be identified based upon the application within which it is implemented in a specific embodiment of the invention. However, it should be appreciated that any particular program nomenclature that follows is used merely for convenience, and thus the invention should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the invention is not limited to the specific organization and allocation of program functionality described herein.

Figure 12:
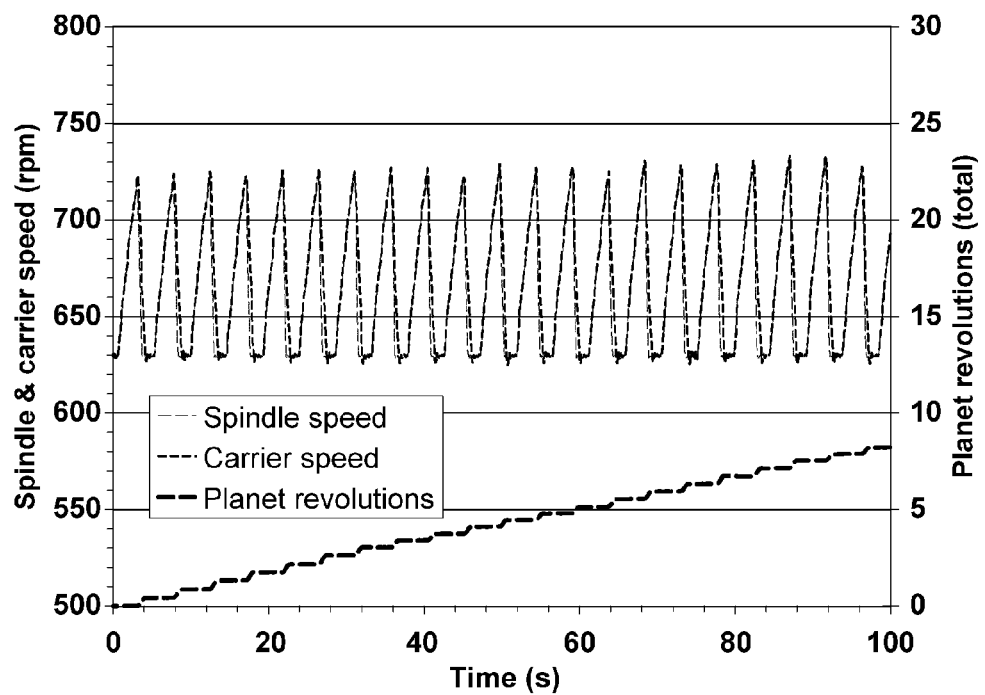
FIG. 12 is alternative graphical representation of FIG. 11.

FIG. 12 provides an alternative graphical representation of the operation mode shown in FIG. 11. This graph shows the number of revolutions the planet performs based on the oscillations in the spindle (also referred to as drive shaft) and carrier's angular velocities.

Figure 13:
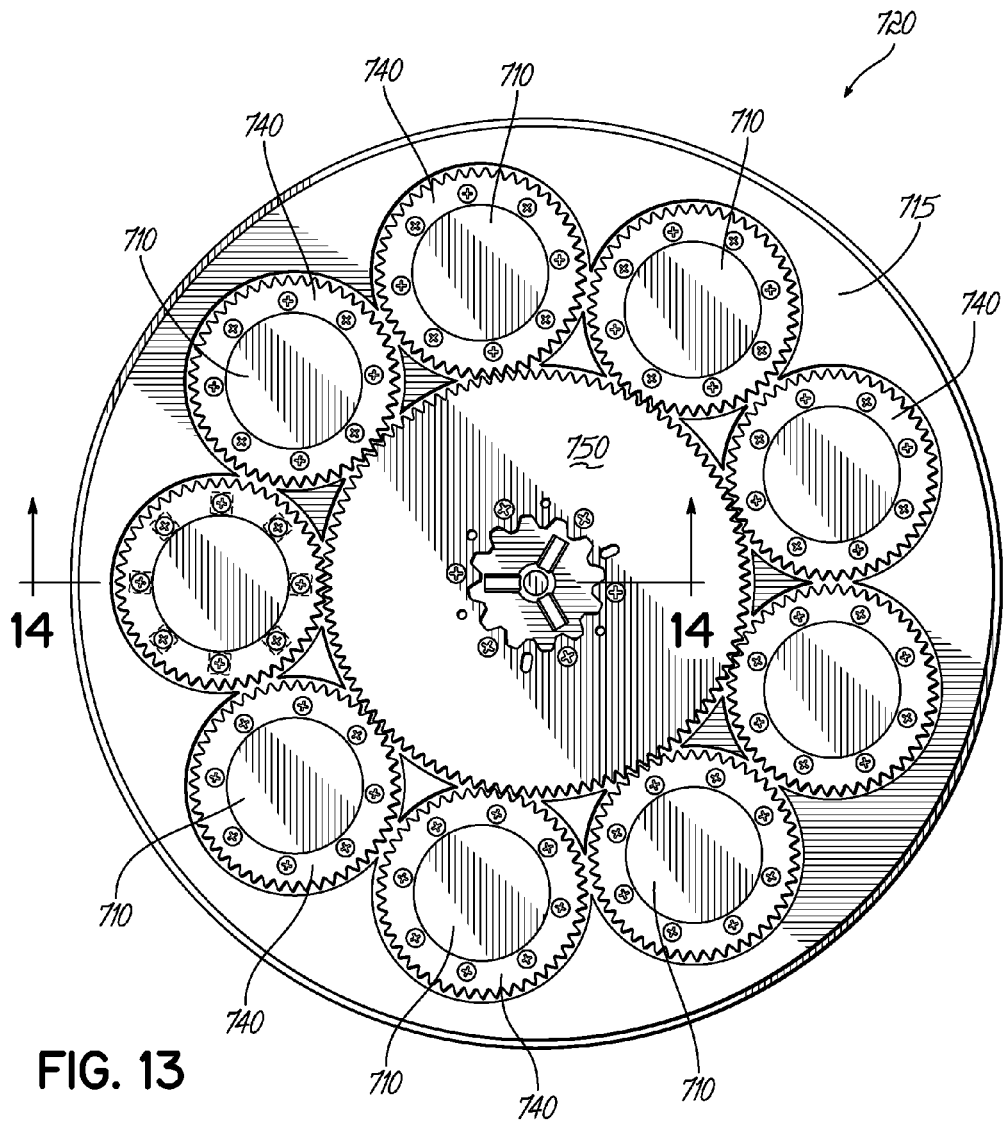
FIG. 13 is a bottom view of a wafer carrier in accordance with an embodiment of the invention.
Figure 15:
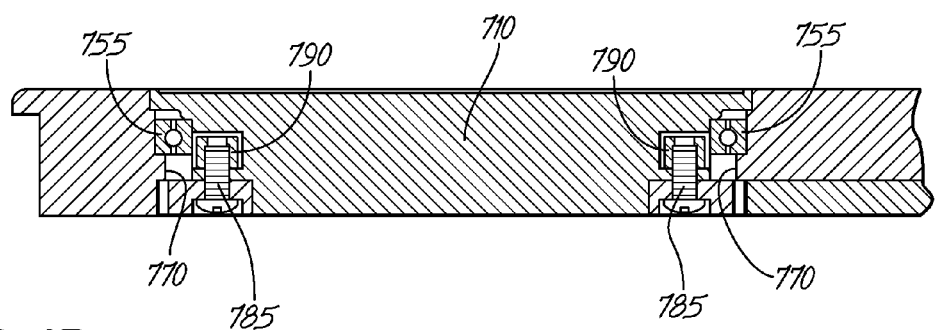
FIG. 15 is an enlarged view of a portion of FIG. 13 showing a wafer platform of the wafer carrier.
Figure 14:
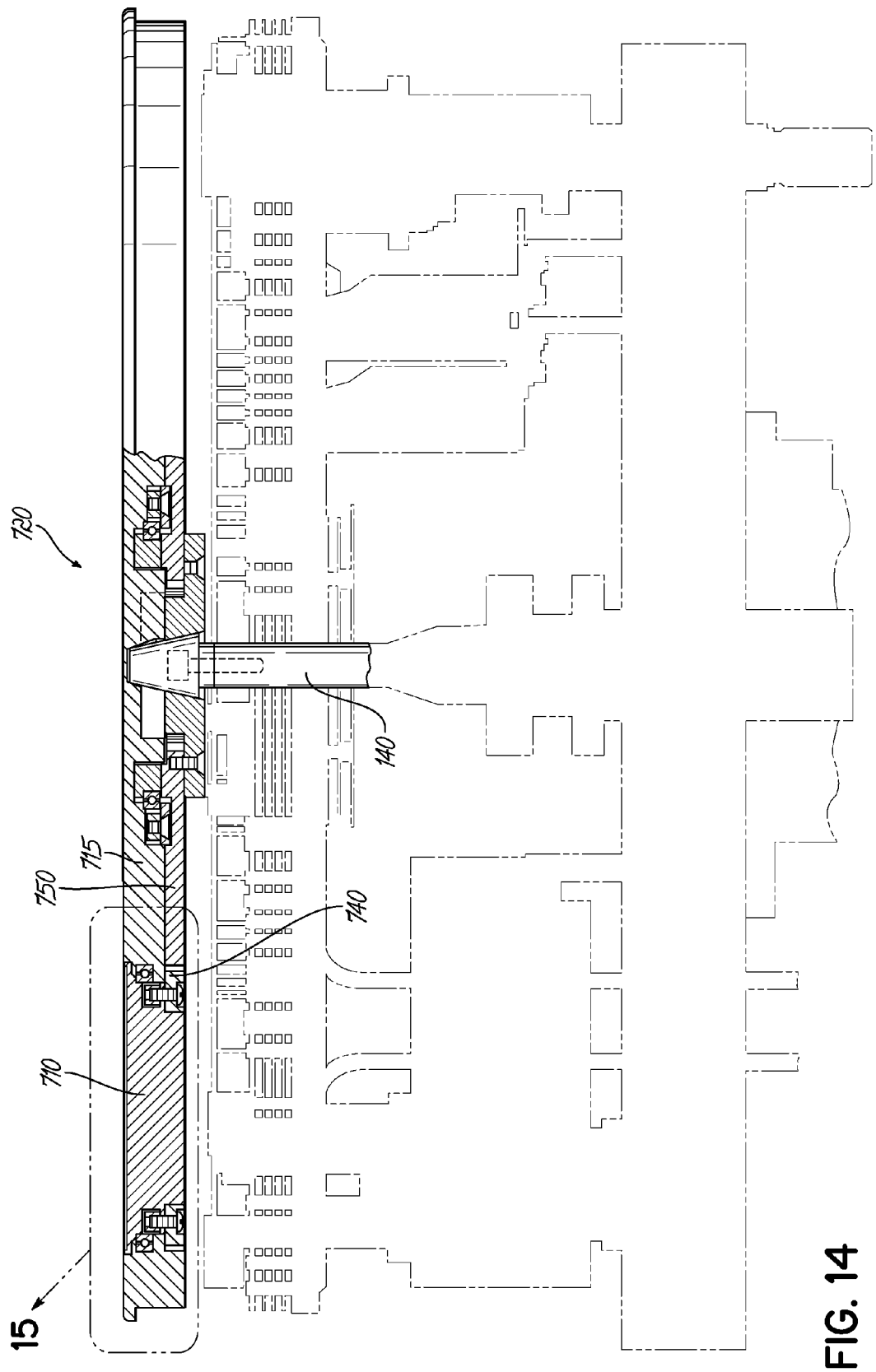
FIG. 14 is a cross-sectional view taken generally along line 14-14 of FIG. 13.

With reference to FIGS. 13-15 in which like reference numerals refer to like features in FIGS. 1-12 and in accordance with an alternative embodiment of the invention, a wafer carrier 720 includes a platen 715, wafer platforms 710 arranged peripherally about the platen 715, a central gear 750, and platform gears 740. Each wafer platform 710 is configured to support a wafer 200 (FIG. 1). The platen 715 of the wafer carrier 720 is seated over the drive shaft 140, which is rotated by motor 120 (FIG. 1), and rides on a friction-reducing bearing 755. The teeth of the central gear 750 are connected with the platform gears 740 through a meshing of the gear teeth. As the drive shaft 140 spins, the central gear 750 rotates and causes the platform gears 740 to rotate so that each individual wafer platform 710 is spun about its central axis. Specifically, the central gear 750 transmits rotation of the drive shaft 140 as powered rotary motion to the platform gears 740. As a consequence, each of the attached wafer platform 710 rotates in a direction counter or opposite to the direction of rotation of the platen 715. In an equilibrium state, each wafer platform 710 makes a single revolution for every revolution of the central gear 750. Each of the platform gears 740 has outward facing and circumferentially distributed teeth that mesh with the outward facing and circumferentially distributed teeth of the central gear 750.

The wafer platforms 710 have a circular arrangement of positions or locations on the platen 715. Specifically, a reference point associated with each of the wafer platforms 710 may be arranged on the circumference of a reference circle having a center of the platen 715 as a center. Each of the wafer platforms 710 is disposed in a compartment 770 of similar dimensions in the platen 715 and rides on a friction-reducing bearing 765. The wafer platforms 710 are disks with a round shape and the platen 715 is likewise a round disk of larger diameter than the wafer platforms 710.

The platen 715 and the wafer platforms 710 may be comprised of graphite. Fasteners 785, which may be comprised of a ceramic material, may be used to secure the central gear 750 to the platen 715 and each platform gear 740 to its respective wafer platform 710. Due to the relative softness and brittleness of graphite as a structural material, measures may be taken to reinforce the platen 715, as well as each wafer platform 710, at the fastener attachment points of the fasteners 785. To that end, threaded inserts 790 may be secured within cavities of similar dimensions in the platen 715 and each wafer platform 710. The threaded inserts 790 may be comprised of molybdenum, which is machinable to form a threaded opening with threads having a higher mechanical strength than graphite threads. The threading of the opening is machined to match the threading of the fasteners 785.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Furthermore, to the extent that the terms "includes", "having", "has", "with", "composed of", or variants thereof are used in either the detailed description or the claims, such terms are intended to be inclusive in a manner similar to the term "comprising."

While the invention has been illustrated by a description of various embodiments and while these embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative methods, and illustrative examples shown and described. Accordingly, departures may be made from such details without departing from the spirit or scope of applicant's general inventive concept.

What is claimed is:

1. A wafer carrier for a plurality of wafers, the wafer carrier comprising:
   a platen with a plurality of compartments, the platen configured to rotate about a first axis;
   a plurality of wafer platforms, each of the wafer platforms associated with one of the compartments and configured to rotate about a respective second axis relative to the respective compartment, and the platen and the wafer platforms rotate with different angular velocities to create planetary motion therebetween;

a drive shaft;

a plurality of first gears, each of the first gears attached to one of the wafer platforms; and a second gear meshed with each of the first gears, the second gear being coupled with the drive shaft to be rotated by the drive shaft and transfer the rotation to the first gears to cause powered rotation of the wafer platforms.

2. The wafer carrier of claim 1 wherein the platen is coupled with the drive shaft so that rotation of the drive shaft causes powered rotation of the platen about the first axis.

3. The wafer carrier of claim 1 further comprising: a plurality of friction-reducing bearings, one of the friction-reducing bearings disposed between each of the wafer platforms and the platen.

4. The wafer carrier of claim 1 wherein the platen and the wafer platforms are configured to rotate at different angular velocities.

5. The wafer carrier of claim 1 wherein the compartments have a circular arrangement on the platen.

\* \* \* \* \*